United States Patent
Pistner et al.

(10) Patent No.: US 11,814,718 B2
(45) Date of Patent: Nov. 14, 2023

(54) METHOD FOR PRODUCING COATED SUBSTRATES

(71) Applicant: Bühler Alzenau GmbH, Alzenau (DE)

(72) Inventors: Jürgen Pistner, Alzenau-Michelbach (DE); Harro Hagedorn, Frankfurt a.M. (DE)

(73) Assignee: Bühler Alzenau GmbH, Alzenau (DE)

( * ) Notice: Subject to any disclaimer, the term of this patent is extended or adjusted under 35 U.S.C. 154(b) by 207 days.

(21) Appl. No.: 15/563,129

(22) PCT Filed: Mar. 31, 2016

(86) PCT No.: PCT/EP2016/057065
§ 371 (c)(1),
(2) Date: Sep. 29, 2017

(87) PCT Pub. No.: WO2016/156496
PCT Pub. Date: Oct. 6, 2016

(65) Prior Publication Data
US 2018/0087142 A1    Mar. 29, 2018

(30) Foreign Application Priority Data
Mar. 31, 2015   (DE) .................. 102015104977.5

(51) Int. Cl.
*C23C 14/34* (2006.01)
*C23C 14/00* (2006.01)
(Continued)

(52) U.S. Cl.
CPC ........ *C23C 14/0078* (2013.01); *C23C 14/547* (2013.01); *H01J 37/18* (2013.01);
(Continued)

(58) Field of Classification Search
CPC ................. H01J 37/18; H01J 37/32036; H01J 37/32119; H01J 37/32155; H01J 37/3464;
(Continued)

(56) References Cited

U.S. PATENT DOCUMENTS

| 5,225,057 | A | | 7/1993 | LeFebvre et al. |
| 5,415,757 | A | * | 5/1995 | Szcyrbowski ...... C23C 14/0036 |
| | | | | 204/192.12 |

(Continued)

FOREIGN PATENT DOCUMENTS

| CN | 1491293 A | 4/2004 |
| CN | 1714422 A | 12/2005 |

(Continued)

OTHER PUBLICATIONS

Machine Translation JP 63-083259 dated Apr. 1988. (Year: 1988).*
(Continued)

*Primary Examiner* — Rodney G McDonald
(74) *Attorney, Agent, or Firm* — NK Patent Law

(57) ABSTRACT

The invention relates to a method for producing substrates having a plasma coated surface made of a dielectric coating material in a vacuum chamber, having an AC-powered plasma device, comprising moving a substrate relative to the plasma device by means of a movement device along a curve, and depositing coating material on a surface of the substrate in a coating region along a trajectory lying on the surface of the substrate using the plasma device.

17 Claims, 5 Drawing Sheets

(51) Int. Cl.
*C23C 14/54* (2006.01)
*H01J 37/18* (2006.01)
*H01J 37/32* (2006.01)

(52) U.S. Cl.
CPC ... *H01J 37/32036* (2013.01); *H01J 37/32119* (2013.01); *H01J 37/32155* (2013.01)

(58) Field of Classification Search
CPC . H01J 37/3467; H01J 37/347; C23C 14/0078; C23C 14/547
USPC .......................... 204/192.13, 298.03, 298.08
See application file for complete search history.

(56) References Cited

U.S. PATENT DOCUMENTS

| | | | |
|---|---|---|---|
| 5,618,388 A * | 4/1997 | Seeser .................. | C23C 8/02 |
| | | | 118/719 |
| 6,207,536 B1 * | 3/2001 | Matsumoto ......... | C23C 14/0078 |
| | | | 438/478 |
| 2004/0026240 A1 | 2/2004 | Shidoji et al. | |
| 2006/0151312 A1 | 7/2006 | Scherer et al. | |
| 2011/0248633 A1* | 10/2011 | Nauman ............. | C23C 14/3485 |
| | | | 315/111.21 |

FOREIGN PATENT DOCUMENTS

| | | |
|---|---|---|
| CN | 1821438 A | 8/2006 |
| DE | 2700979 A1 | 8/1977 |
| DE | 271827 A3 | 9/1989 |
| DE | 69421033 T2 | 5/2000 |
| DE | 10008482 A1 | 9/2001 |
| DE | 10234855 A1 | 2/2004 |
| DE | 102013101269 A1 | 8/2014 |
| EP | 0349556 A1 | 1/1990 |
| EP | 0516436 A2 | 12/1992 |
| EP | 0716160 A1 | 6/1996 |
| EP | 0795623 A1 | 9/1997 |
| EP | 1198607 A1 | 4/2002 |
| EP | 1552544 A1 | 7/2005 |
| EP | 1592821 A2 | 11/2005 |
| JP | 63-083259 * | 4/1988 |
| JP | 2006503181 A | 1/2006 |
| JP | 2006509102 A | 3/2006 |
| JP | 2006265739 A | 10/2006 |
| JP | 2014043600 A | 3/2014 |
| TW | 200502417 A | 1/2005 |
| WO | WO0173151 A1 | 10/2001 |
| WO | WO2005008717 A2 | 1/2005 |
| WO | WO2014050319 A1 | 4/2014 |
| WO | WO2017050319 A1 | 3/2017 |

OTHER PUBLICATIONS

JPO, Japanese Office Action for Japanese Patent Application No. 2017-551229, dated Jun. 7, 2019.
JPO, Japanese Office Action for Japanese Patent Application No. 2017-551229, dated Jul. 23, 2018.
CNIPA, Chinese Office Action for Chinese Patent Application No. 201680024331.6, dated Feb. 22, 2019.
CNIPA, Chinese Search Report for Chinese Patent Application No. 201680024331.6, dated Feb. 11, 2019.
CNIPA, Second Chinese Office Action for Chinese Patent Application No. 201680024331.6, dated Oct. 12, 2019.
ISA/EP, International Search Report for PCT Patent Application No. PCT/EP2016/057065, dated Jun. 29, 2016.
IPEA/EP, International Preliminary Report on Patentability for PCT Patent Application No. PCT/EP2016/057065, dated Jul. 7, 2017.
German Patent and Trademark Office, Office Action for German Patent Application No. 102015104977.5, dated Dec. 8, 2015.
CNIPA, Office Action for Chinese Patent Application No. 201680024331.6, dated Apr. 27, 2020.
CNIPA, Third Office Action for Chinese Patent Application No. 201680024331.6, dated Dec. 11, 2020.

* cited by examiner

METHOD FOR PRODUCING COATED SUBSTRATES

CROSS REFERENCE TO RELATED APPLICATION(S)

This application is a 371 National Phase application of PCT Patent Application No. PCT/EP2016/057065 filed on Mar. 31, 2016, which claims priority to German Patent Application No. 10 2015 104 977.5 filed on Mar. 31, 2015.

BACKGROUND

The invention relates to a method for producing substrates with a plasma-coated surface and to a device for carrying out the method according to the preambles of the independent patent claims.

DESCRIPTION OF RELATED ART

Various methods from the area of physical and chemical deposition techniques are known for producing substrates with a plasma-coated dielectric surface, methods in which coating material from a plasma is deposited on a surface of the substrate, the depositing techniques that are used in each case depending on the material system chosen and aiming to achieve desired properties of the coated surface.

Sputtering (cathode atomization) is the term used hereinafter for the process induced by particle bombardment of ejecting atoms and molecules from the surface of a solid body, in which the effect of an electrical field in a vacuum is used to ignite a plasma, from which ions are accelerated onto a target, these ions ballistically removing atoms from the target, which are then deposited on the walls of the vacuum chamber and on a substrate at a distance from the target. A residual gas pressure prevails in this case, usually predominantly of an inert gas such as argon, which does not have any disturbing influences on the layer that is forming on the substrate. To increase the ion current density, magnetron arrangements are often used. Heating of the material source is not necessary for this; it is instead rather the case that the target is usually cooled during the implementation of the process.

For depositing compounds such as nitrides, carbides or oxides or the like, reactive gases may be additionally admixed with the sputtering gas (residual gas). For producing insulating layers, such as for example $SiO_2$, $Al_2O_3$ and the like, methods in which two targets are used alternately by means of magnetron sputtering cathodes fed by an alternating current source have been developed. The polarities of the target potentials usually alter in the kHz range, i.e. each electrode is alternately the cathode and the anode. This leads to a defined charge transfer between the cathode and the anode without any inhibiting influence of an oxide layer on the target surfaces, by contrast with the disturbing effect of the so-called "disappearing anode" in the case of a reactive DC magnetron sputtering process. For efficient operation, this usually involves working in the so-called transition mode, since otherwise the oxide formation at the target surface is quicker than the rate of removal.

Also known for producing a plasma jet or ion beam are targetless plasma sources, which are excited in a frequency range of between 1 MHz and 100 MHz and may be gridless or have a plasma chamber closed off by a grid, the plasma usually also being acted upon by a magnetic field in the case of these plasma sources.

DE 694 210 33 T2 discloses for example an inductive plasma source which operates in the radio frequency range (RF) and in the case of which the plasma density is increased by magnets arranged outside a vacuum chamber, with a reduced number of system components. DE 100 084 82 A1 discloses a plasma source operating in a high frequency (HF) range with a magnetic field coil arrangement and a unit for extracting a plasma jet, an excitation electrode having a transversal magnetic field superimposed on it, and magnetic field coils being arranged around a volume of plasma to produce a transversal magnetic field. In this case there can be a choice between capacitive and inductive plasma excitation, it being possible to set the ion energy in a range from 10 eV to approximately 1000 eV.

A capacitively coupled plasma source is known from EP 0 349 556 B1, according to which a plasma jet can be extracted, for example for removing and structuring surfaces of solid bodies, for producing surface dopings by particle bombardment or for producing surface layers.

WO 2005/008717 discloses a capacitively excited HF plasma source for producing a plasma jet shaped by magnetic fields, in which a local increase in the plasma density, and consequently operation of the source with relatively low plasma pressures, is made possible by a homogeneous magnetic field, permanent magnets being provided for example to produce the magnetic field.

Also known are devices that have a combination of a sputtering device with a targetless plasma source, for example one of the plasma sources described above.

EP 0 516 436 B1 discloses a combination of a magnetron sputtering device with a secondary plasma device for the reactive deposition of a material on a substrate. The sputtering device and the secondary plasma device respectively form sputtering and activation zones which are atmospherically and physically adjacent. Bringing the sputtering and activation zones together has the effect that the plasmas of the two zones are mixed into a single continuous plasma.

EP 0 716 160 B1 discloses a coating device with a sputtering device and with a device for producing a plasma from low-energy ions. The sputtering and plasma devices can be operated selectively, so as to form a composite layer, which comprises at least a number of layers. The composition of each layer may be chosen from at least one of the following materials: a first metal, a second metal, an oxide of the first metal, an oxide of the second metal, mixtures of the first and second metals and oxides of mixtures of the first and second metals.

EP 1 592 821 A2 discloses a method for producing very low-loss optical layers on a movable substrate in a vacuum chamber with a residual gas by means of a sputtering device. In this case, such a layer is formed from at least two constituents, at least a first constituent being a sputtering material of the sputtering device and at least a second constituent being a reactive component of the residual gas. It is in this case provided that there is a reactive deposition of a layer on the substrate in a spatial region of the sputtering device, with a predetermined stoichiometric deficit of the reactive constituent, a movement of the substrate with the deposited layer into a spatial region of a plasma source that is arranged at a predetermined distance from the sputtering device in the vacuum chamber, and a precise modification of the structure and/or stoichiometry of the layer by the subsequent action of the plasma of the plasma source to reduce an optical loss of the layer. A desired layer thickness of the deposited layer can be set over a coating time, for example also in situ by using an optical layer thickness measurement by an optical monitor.

In the case of many applications of coating methods, important aspects are a predetermined uniformity of the deposited layers with regard to their optical, mechanical and chemical properties and a high degree of reproducibility of a well-established coating process, and consequently corresponding methods for keeping a check on these aspects.

When coating moved substrates, aperture diaphragms are often used to check for layer thickness deviations, such as for example those described in the document Vakuumbeschichtung [vacuum coating] (Gerhard Kienel, published by the Springer Verlag in 1995).

DE 27 00 979 A discloses a method of controlling a vapour-depositing rate and/or the composition of the material to be deposited during a vapour-depositing process in a vacuum, in which a proportion of the material to be deposited flows through a measuring zone in which the material to be deposited is exposed to radiation, the type of radiation being chosen such that the electrons of at least some of the atoms of the material to be deposited that flow through the measuring zone are raised to a higher energy level, and that the photons occurring during the return to the low energy state are registered as a measure of the vapour-depositing rate or as an information signal for the composition of the material to be deposited.

In order to ensure a stable sputtering process at a desired operating point, closed-loop current, voltage and power controls may be used with a constant gas intake, as for example in EP 0 795 623 A1. It is also known from DD 271 827 13 to carry out the closed-loop control of the gas intake with a constant power feed with the aid of a plasma emission monitor. Furthermore, a reactive sputtering process is known from WO 01/73151 A1, the oxygen partial pressure in the sputtering gas being controlled during the sputtering of the oxide by means of a lambda probe.

U.S. Pat. No. 5,225,057 discloses a coating method for forming a thin film on a substrate with a cylindrical sputtering system comprising a sputtering zone for depositing a metallic layer and also a plasma zone, separate from the sputtering zone, of a plasma source for subsequent oxidation of the metallic layer. On account of a movement of the substrate in relation to the sputtering source that is not equidistant, there is a parabolic layer thickness distribution of layers produced by this sputtering system, which is referred to as the chord effect. To compensate for this layer thickness distribution and to produce uniform layers, it is proposed to modulate the sputtering power during the deposition of the metallic layer in a way corresponding to a predetermined profile in dependence on the position of the substrate in relation to the sputtering source. Closed-loop control of the sputtering system or of the layer thickness distribution is not mentioned.

EP 1 198 607 B1 discloses a further method for producing workpieces with which the chord effect is to be compensated. In this case, for the reactive vacuum treatment the workpieces are moved through a treatment atmosphere in a treatment area. The treatment atmosphere is controlled in the treatment area, the treatment atmosphere that is prevailing at the time being recorded by a sensor and the treatment atmosphere being modulated with a predetermined profile as a function of the position of the workpiece. The modulation is performed by changing the desired value of the closed-loop control in a frequency range that lies above the upper limit frequency of the closed control circuit. With this method it is intended to accomplish specifically a desired layer thickness distribution for workpieces that are moved in the treatment atmosphere, independently of their movement path and movement alignment. It is also proposed that preferably two or more forms of modulation curves are prestored in a modulation unit and are selectively activated for the respective working process by means of a selection unit. With the prestored different forms of modulation curves, different substrate treatments can be catered for at the same installation.

Also in the case of this known method, closed-loop control of the layer thickness distribution is not proposed or discussed, but instead the layer thickness distribution is set in an open-loop controlled manner.

EP 1 552 544 B1 also discloses a method for producing magnetron-sputter-coated substrates, in which a magnetron magnetic field pattern is cyclically moved along the sputtering area on a magnetron source with a sputtering area, the substrate is at a distance from the sputtering area and is moved over it, the amount of material that is deposited on the substrate per unit of time being modulated cyclically in a phase-locked relationship with the cyclical movement of the magnetic field pattern. In particular, it is proposed that the distribution of the amount of material deposited at the time on the substrate is measured as a measured controlled variable, is compared with a desired distribution and, in accordance with the result of the comparison as a system deviation, the profile of the phase-locked cyclical change is provided as a correcting variable in a control circuit for the distribution mentioned. In the case of this method, it is assumed that, with a two-dimensional or three-dimensional cyclical movement of the magnetron magnetic field pattern, in principle the movement component that is perpendicular to the direction of movement of the substrate is decisive. With the known method, it is intended in particular to achieve the effect that there is no need for aperture diaphragms.

The aim of the known prior art is merely to compensate for layer thickness distributions that deviate from desired distributions because of the chord effect or mechanical inaccuracies of the installations. Deviations from a predetermined layer thickness distribution that are caused by the individual plasma conditions of the deposition process and by the varying thickness and varying dielectric properties of the deposited dielectric layer itself are not taken into account.

The document DE 10 2013 101 269 A1 describes how in the case of magnetron sputtering a measurement of properties of the layer can be performed, transmission, reflection and/or sheet resistance measurements being carried out on certain measuring lines on the substrate. The corresponding device comprises so-called gas passage segments, each with their own gas inlet for the separate coating of regions of the substrates. The following is stated in paragraph [0022] of this document: The user can in this case carry out an analysis of the layer at every location at which the properties of the layer can be influenced by changing the amount and composition of the process gas. A location in the arrangement described in the document is meant here, not a location on the substrate.

The document DE 102 34 855 A1 describes a device for setting a predetermined layer thickness distribution by means of a coating source, in which a through-opening for the vapour between the coating source and the substrates is delimited by at least two partial screens that are movable in relation to the transporting direction of the substrate. For reasons of its structural design, this device cannot be used for setting a layer thickness distribution in the direction of movement of a substrate to be coated. It correspondingly states in paragraph [010] of this document: In this way, the achievable layer thickness distribution can be set in very fine stages with high spatial resolution transversely to the direction of movement of the substrates.

From the document US 2004/0026240 A1, a method for depositing a sputtering film using a sputtering device is already known, wherein a drum formed with a polygonal or circular shape in transverse cross-section is provided to be rotatable in a chamber. The drum has substrate holders provided on an outer peripheral surface. Further, magnetron sputtering sources are provided inside of a chamber wall. Each of the magnetron sputtering sources comprises a target and a magnetron unit for holding the target. The targets are held by the magnetron units so as to be parallel to a rotation axis of the drum. The known method comprises performing the film deposition, wherein the substrate holders are rotated by the rotation of the drum at a constant speed. Further, measuring a thickness of a film deposited on a substrate mounted on a substrate holder during film deposition and controlling parameters or rules of parameters that influence an amount of film deposition based on measurement results obtained by the film thickness measuring step. The method further comprises, starting the film deposition, performing a rapid film deposition using an AC magnetron sputtering source, stopping the film deposition by the AC magnetron sputtering source after the thickness of the film has reached a value that is just smaller than a film thickness which is targeted and then changing the fast film deposition to a slow film deposition merely by using a magnetron sputtering source with a target mounted on a single magnetron unit to perform the film deposition until the targeted film thickness is reached.

The known method is specifically intended for carrying out the chordal effect, since in the otherwise conventional deposition methods, the substrate is coated in a drum system in its edge region with more atoms than in its central region. Nevertheless, to achieve a uniform film thickness, the prior art method proposes to use sputter sources with a specially shaped target having the shape of an inverted V.

From WO 2014/050319 A1, a film-forming apparatus is already known, with a film thickness measuring section, in which the film thickness is measured ex situ in dependence on the intensity of the reflected light.

BRIEF SUMMARY

Investigations carried out by the applicant into the layer thickness distribution of dielectric layers that have been deposited by means of a plasma device operated with alternating current have shown deviations in the direction of movement of the substrate from a layer thickness distribution to be expected with a constant cathode power, in particular a drop in the layer thickness at the periphery that is not attributable to a chord effect or to mechanical inaccuracies of the installation, but instead are caused by the specific plasma conditions of the deposition process, such as for example the electrical field of the plasma boundary layer. It was also found in these investigations that one of the factors on which the observed layer thickness is dependent is structures of the substrate mounting, for example the size and position of openings in which the substrates are accommodated, the material of the substrate and of the substrate mounting and the speed with which the substrates are moved.

The object of the present invention is to provide a method and a device with which coating material can be deposited on a surface of a substrate with a small deviation from a predetermined layer thickness distribution in the direction of movement of the substrate, it also being possible to take into account and compensate for deviations that are due to the individual plasma conditions of the deposition process.

The object is achieved by the features of the independent claims.

The method according to the invention for producing substrates with a plasma-coated surface of a dielectric coating material, selected from a group comprising at least one of the elements silicon, aluminum, magnesium, hafnium, zirconium, niobium, tantalum, titanium, scandium and/or their oxides or nitrides, in a vacuum chamber, which has a plasma device operated with alternating current, comprising moving a substrate in relation to the plasma device along a curve by means of a movement device, depositing coating material on a surface of the substrate in a coating region along a trajectory lying on the surface of the substrate by means of the plasma device, with a) determining actual values of a layer thickness of deposited coating material on at least parts of the trajectory in the direction of movement of the substrate b) comparing the actual values with desired values of the layer thickness on the at least parts of the trajectory c) determining parameters of the plasma device for altering the amount of coating material deposited per unit of time in dependence on the position of the substrate in such a way that the actual values of the layer thickness of deposited coating material deviate from the desired values by less than a predetermined difference d) setting parameters of the plasma device for altering the amount of coating material deposited per unit of time according to item c) and e) depositing coating material by means of the plasma device with the parameters set in item d).

The invention is characterized in that the setting of the parameters according to point d) comprises an electrical power of the plasma device, wherein, in order to compensate for a deviation from a layer thickness distribution to be expected at a constant electrical power, the electrical power is modulated in accordance with a predetermined profile.

In the method there is a movement of a substrate in relation to the plasma device along a curve by means of a movement device. By means of the plasma device, coating material is deposited on a surface of the substrate in a coating region along a trajectory lying on the surface of the substrate. The trajectory is understood here preferably as meaning the path or the movement path of the coating region when the substrate is being moved in relation to the plasma device.

The coating region is established by the coating window of the plasma device. Here, an area that is at a distance from the plasma device and on which coating material is deposited when the substrate is not moved in relation to the plasma device is referred to as the coating window.

After a certain coating time or, in the case of a turntable device, a certain number of coating passes of the substrate, the actual values of the layer thickness of deposited coating material deviate from the desired values by less than a predetermined difference. Therefore, additional coating material is deposited in dependence on the difference between actual values of the layer thickness and the desired values. Desired values that correspond to a uniform layer thickness are preferably chosen. However, it goes without saying that graduated layer distributions can also be produced with the method according to the invention.

The plasma device may have an aperture diaphragm known per se, in order additionally to achieve a uniform layer thickness distribution perpendicularly to the direction of movement of the substrate. However, the layer thickness distribution in the direction of movement of the substrate cannot be corrected with such an aperture diaphragm.

It is known from the document "The origins of self-bias on dielectric substrats in RF plasma processing, surface and coatings technology" 200 (2006) 3670-3674 (Y. Yin et al.) that, in the case of dielectric layers, the layer-adjacent self-bias is sensitively dependent on the plasma conditions of the deposition process. For example, the self-bias in the case of a dielectric substrate is influenced by the substrate thickness and by the accumulation of surface charges, in turn determined by the plasma conditions. Self-bias produces an etching back of the growing layer and thereby influences the layer thickness distribution and other properties of the deposited layer.

With the method according to the invention it is also possible in particular to compensate for deviations of the layer thickness from a predetermined layer thickness distribution on the trajectory in the direction of movement of the substrate that are caused by the changing individual plasma conditions of the deposition process during the movement of the substrate and by the varying thickness and varying dielectric properties of the deposited dielectric layer itself. This is possible because additional coating material is deposited in dependence on the difference between actual values of the layer thickness and the desired values, irrespective of the cause of the difference.

It is envisaged according to the invention to always make the actual values of the layer thickness of at least parts of a trajectory lying on the surface of the substrate approximately equal to the desired values of the layer thickness. For this purpose, according to the invention the actual values are compared with desired values of the layer thickness and parameters of the plasma device are determined in order to alter the amount of coating material deposited per unit of time (coating rate) in dependence on the position of the substrate. A position of the coating window of the plasma device in relation to the substrate surface in this case preferably corresponds to the position of the substrate.

The invention takes into account in particular that, when the plasma device is operated with a plasma excitation at RF (13.56 MHz) and MF (40 kHz), on the substrate there is a self-bias that is dependent on the geometry and the material of the surroundings of the substrate and also the electrical charging of the surroundings and of the substrate.

The investigations carried out by the applicant have shown that, in the case of moved substrates and constant power of a sputtering cathode, a drop in the layer thickness at the periphery is much greater in the case of coating material comprising elements such as Si and Al, Mg and their oxides and nitrides than in the case of Nb, Hf and Ta and their oxides and nitrides, with which the drop in the layer thickness at the periphery was below the detection limit.

The investigations carried out by the applicant have also shown that, in the case of moved substrates and constant power of a sputtering cathode, a drop in the layer thickness at the periphery with RF plasma excitation is greater than with MF plasma excitation; for example, in the case of SiO2 layers on substrates with a diameter of 200 mm, a drop in the layer thickness at the periphery of 2% with RF—as opposed to a drop in the layer thickness at the periphery of 0.6% with MF.

The plasma device is preferably operated with RF or MF, or the deposition is carried out by means of a plasma excited with RF or MF. The invention makes it possible to reduce the drop in the layer thickness at the periphery significantly in the case of flat substrates, for example from 2% to 0.5% when sputtering SiO2 with RF plasma excitation in the case of a substrate with a diameter of 200 mm.

The invention accordingly makes it possible in an easy way to take account of the influence of the geometry and material of the surroundings of the substrate on the deposition process. In particular, the mechanical and electrical construction of the plasma device and also the vacuum chamber can be much simpler and less costly, since the design of the plasma device and/or the vacuum device no longer has to make allowance for whatever electrical potentials occur during the deposition process, but instead, by determining and setting parameters of the plasma source according to items c) and d), the amount of coating material deposited per unit of time is altered in order advantageously to compensate for the influence of the geometry and material of the surroundings of the substrate on the deposition process.

As a difference from the method known from EP 1 198 607 B1, according to which the layer thickness is controlled in an open-loop manner, if in the case of the present invention the determined actual values of the layer thickness do not deviate by less than the predetermined difference from the desired values, the plasma device is operated in such a way that the deposited amount of coating material is altered until the actual values of the layer thickness deviate from the desired values by less than a predetermined difference.

An embodiment of the method according to the invention is distinguished by the fact that parameters of the power supply and/or parameters of the gas supply to the plasma device and/or parameters of the plasma emission from the plasma device are set according to item d). In this case, the plasma device may be controlled in an open-loop or closed-loop manner in order to influence the deposition rate and/or further properties of the layer, such as for example the layer thickness, adhesion, internal stress, surface morphology or microstructure.

A further embodiment of the method is distinguished by determining the actual values by measuring in situ in the vacuum chamber according to item a). In principle, determining the actual values by measuring in situ in the vacuum chamber has the advantage that the removal of the substrate from the vacuum chamber, and the effort involved, can be avoided, and consequently the reliability of the process can be increased and the time taken for the process can be reduced.

Determining the actual values in situ may be performed for example by an optical monitoring system.

After the measurement of the actual values, the comparison according to item b) takes place. If the actual values of the layer thickness of deposited coating material deviate from the desired values by less than a predetermined difference, the substrate can be further processed, in particular removed from the vacuum chamber. Otherwise, item c) and item d) are performed, and there is further depositing of coating material.

A further embodiment of the method is distinguished by removing the substrate from the vacuum chamber before item a) and determining the actual values by measuring ex situ outside the vacuum chamber according to item a), whereby a greater accuracy in the determination of the actual values can be achieved. The measurement of the actual values preferably takes place in a spectral-ellipsometric manner with a spectral ellipsometer. After the measurement of the actual values, the comparison according to item b) takes place. If the actual values of the layer thickness of deposited coating material deviate from the desired values by less than a predetermined difference, the substrate can be further treated, possibly in or outside the vacuum chamber. Otherwise, item c) and item d) are performed, and there is further depositing of coating material on the substrate, which has been reintroduced into the vacuum chamber.

A further embodiment of the method is distinguished by the fact that the power supply parameters are an electrical current, an electrical voltage, an electrical power and/or a plasma impedance. According to the invention, therefore, an electrical current, an electrical voltage, a plasma impedance and/or an electrical power are changed or modulated in dependence on the position of the substrate.

A further embodiment of the method is distinguished by the fact that the gas supply parameters of the plasma device are a working gas flow and/or a reactive gas flow into the plasma device or into a space between the plasma device and the substrate.

A further embodiment of the method is distinguished by the fact that the plasma device is formed as a sputtering source with one or more sputtering cathodes (sputtering targets) or comprises such a sputtering source and the depositing takes place as sputtering. The sputtering source may be controlled in an open-loop manner. As known per se, the sputtering source may in this case be operated in particular in metallic mode or in reactive mode, or by switching the reactive discharge back and forth between metallic mode and reactive mode. The sputtering source may also be actively controlled in a closed-loop manner.

Preferably, an electrical power of the sputtering cathode or of the sputtering cathodes, and consequently the deposition rate, is altered or modulated in dependence on the position of the substrate. With preference, the electrical power is modulated in a way corresponding to a triangular profile, a rectangular profile, a sinusoidal profile, a $Sin^2$ profile or a pulse profile. It goes without saying that these profiles may also be used for power modulation in the case of other plasma devices as sputtering sources.

A further embodiment of the method is distinguished by the fact that the depositing takes place by means of a plasma device which is formed as a targetless plasma source or comprises such a plasma source.

A further embodiment of the method is distinguished by depositing by means of a sputtering source and an additional plasma treatment of the substrate, as is known per se from EP 1 592 821 A2. The sputtering source may in this case also be operated in metallic mode or in reactive mode. Use of the method is particularly advantageous for depositing by means of a sputtering source and an additional plasma treatment of the substrate, since the additional plasma treatment can strongly influence the plasma conditions, in particular the electrical potentials during the deposition process.

A further embodiment of the method is distinguished by moving the substrate along a linear curve, such as for example in the case of an inline installation. Alternatively or in addition, moving the substrate along a nonlinear curve, in particular a curve formed as a circle or an arc of a circle, may also be provided. This may be performed for example by means of a turntable installation or a cylinder installation.

A further embodiment of the method is distinguished by moving the substrate along a curve that runs equidistantly from the plasma device.

A further embodiment of the method is distinguished by moving the substrate along a curve that runs non-equidistantly with respect to the plasma device, in particular is formed concavely or convexly, and determining parameters of the plasma device for altering the amount of coating material deposited per unit of time according to item c) until the actual values deviate from the desired values by less than a predetermined difference, for example also with the exclusion of the chord effect.

A further embodiment of the method is distinguished by selection of the coating material from a group that comprises at least one of the elements silicon, aluminium, magnesium, hafnium, zirconium, niobium, tantalum, titanium, scandium and/or their oxides or nitrides.

A further embodiment of the method is distinguished by use of a disc-shaped substrate.

A further embodiment of the method is distinguished by use of a disc-shaped substrate with a greatest linear dimension or greatest diameter smaller than a coating window of the plasma device. Here, an area that is at a distance from the plasma device and on which coating material is deposited when the substrate is not moved in relation to the plasma device is referred to as the coating window.

For the case where a plurality of identical substrates are moved at equivalent positions of the movement device and it is intended for depositing of coating material to take place on a surface of the substrate in a coating region along a trajectory lying on the surface of the substrate by means of the plasma device, it goes without saying that not only can the determined parameters be used for the depositing of coating material on a substrate for which the actual values of a layer thickness have been determined, but that also the depositing of coating material on some or all of the other substrates can be performed with the set parameters of the plasma device. In the case of one embodiment of the invention, for example, substrates of the same diameter, the same substrate thickness and the same material may be coated with the same parameters of the plasma device to produce substrates with layers with the same layer thickness profiles if they are arranged at equivalent positions of the movement device. The set parameters may then be stored as a process profile.

According to a further aspect of the invention, a method is provided for producing substrates that are provided with a plasma-coated surface of a dielectric coating material in a vacuum chamber by a coating installation, in which the coating installation has a plasma device operated with alternating current.

The following is in this case envisaged:

providing at least one selectable process profile by means of a memory module of a control module, selecting one of the provided process profiles by means of an input unit of the control module, the selected process profile being assigned to the control module as an operating configuration, controlling the means of movement, the plasma source or the substrate being moved by means of the controlled means of movement along a contour of the surface in relation to the surface of the substrate on the basis of the stored process profile assigned as an operating configuration, recording measuring parameters at at least one measuring point of the contour on the surface of the substrate by means of a measuring sensor of the installation, quantifying the material-characteristic parameters determined by means of the sensor by the control module on the basis of predefined surface classifications, predefined material-characteristic parameter ranges being respectively assigned to a surface classification and the corresponding quantification of the corresponding surface classification taking place by triggering material-characteristic parameter ranges on the basis of the material-characteristic parameters, generating a plasma-source control signal by a computing module of the control module on the basis of the surface classification and a plasma-source parameter profile of the process profile, which characterizes the correlation between the surface classification and the plasma-source control signal, and controlling the plasma source by means of the plasma-source control signal in a way corresponding to the surface classification and plasma-source parameter profile of the process profile for depositing coating material on a surface of the substrate in a coating region along a trajectory lying on the surface of the substrate by means of the plasma device.

The invention is characterized in that the plasma source profile comprises an electrical power of the plasma device, wherein the electric power is modulated accordingly to compensate for a deviation from a layer thickness distribution to be expected at a constant electric power.

A device according to the invention for producing substrates with a plasma-coated surface of a dielectric coating material, selected from a group comprising at least one of the elements silicon, aluminum, magnesium, hafnium, zirconium, niobium, tantalum, titanium, scandium and/or their oxides or nitrides, in a vacuum chamber that has a plasma device operated with an alternating current, comprising a movement device for moving a substrate in relation to the plasma device along a curve, with depositing of coating material taking place on a surface of the substrate in a coating region along a trajectory lying on the surface of the substrate by means of the plasma device, is distinguished by a control module which is designed and set up for a1) determining actual values of a layer thickness of deposited coating material on at least parts of the trajectory in the direction of movement of the substrate by means of a layer thickness measuring device, b1) comparing the actual values with desired values, made available by a predetermining device, of the layer thickness on the at least parts of the trajectory by means of a comparing device, c1) determining parameters of the plasma device by means of a computing module of the control module for altering the amount of coating material deposited per unit of time in dependence on the position of the substrate in such a way that the actual values of the layer thickness of deposited coating material deviate from the desired values by less than a predetermined difference, d1) setting parameters of the plasma device by means of a setting module of the control module for altering the amount of coating material deposited per unit of time according to item c1) and e1) depositing coating material by means of the plasma device with the parameters set in item d).

The invention is characterized in that the setting of the parameters according to point d1) comprises an electrical power of the plasma device, wherein, in order to compensate for a deviation from a layer thickness distribution to be expected at a constant electrical power, the electrical power is modulated in accordance with a predetermined profile.

The device has the corresponding advantages of the method according to the invention.

BRIEF DESCRIPTION OF THE DRAWINGS

The invention is described more specifically below on the basis of exemplary embodiments represented in drawings, also disclosing further features, details and advantages of the invention independently of the summary given in the patent claims.

In the schematic drawing.

The same elements are designated in the figures by the same reference numerals.

DETAILED DESCRIPTION

Figure 1:
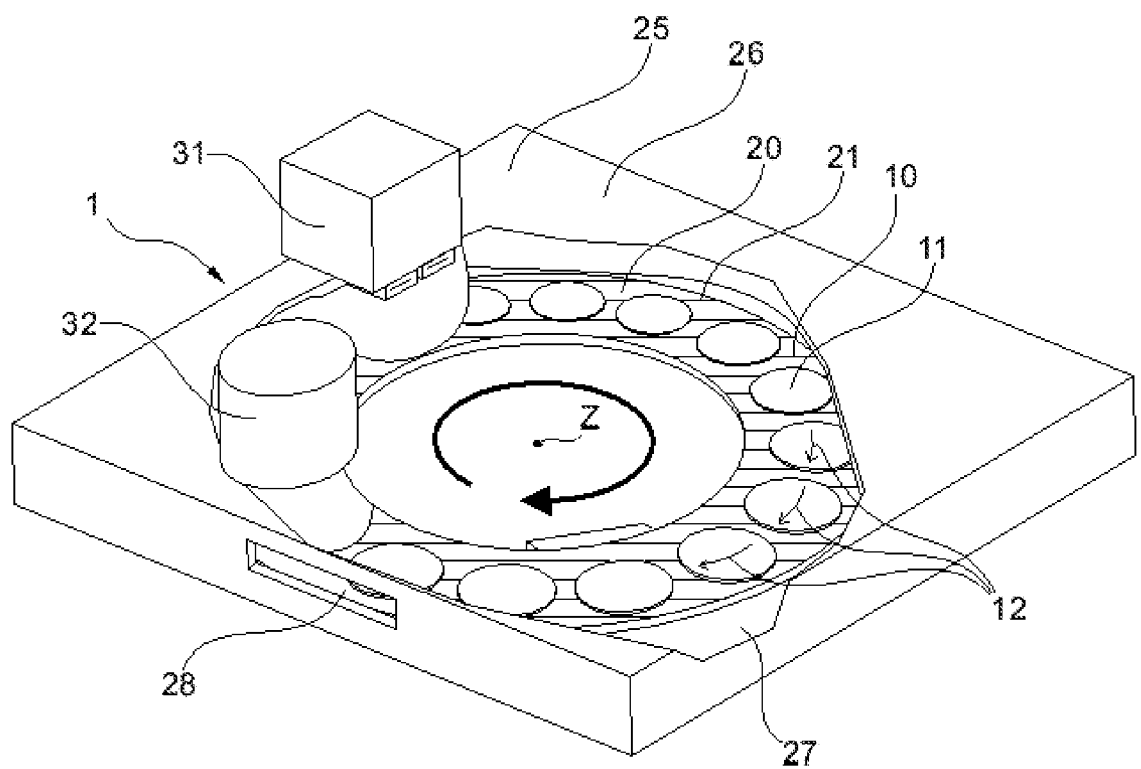
FIG. 1 shows a diagram of a preferred device for the sputter coating of substrates.

FIG. 1 shows a schematic representation of a preferred device 1 for the sputter coating of substrates 10 in a sputter-down configuration, with the possibility of an additional plasma treatment of the substrates 10. The device 1 is arranged in a vacuum chamber that is not represented. The device 1 comprises a process module 25 with a plasma device which is operated with alternating current and is formed as a sputtering source 31, and also with a plasma source 32. The device 1 also comprises an optional covering 26 and a movement device, which is formed as a turntable device 20, arranged underneath the covering 26, for moving the substrate 10 in relation to the plasma device 31 along an arc of a circle. The turntable device 20 can receive a plurality of substrates, which are moved about the axis Z. The substrates 10 may for example be accommodated in suitable openings in a substrate turntable 21 in the form of a circular ring. The substrate turntable 21 can be loaded with substrates and unloaded by way of an air lock 28. The substrates may be heated by means of a heating device 27, the heating device 27 preferably being formed as a radiant heater with quartz radiators. This allows the substrates to be heated to several 100°, for example to 250° C.

The movement device 20 may preferably be operated with a settable speed of the turntable 21 of between 1 and 500 rpm. Instead of a planar movement device, a drum-shaped device known per se may also be used for moving the substrate or substrates. In this case, the sputtering source and the plasma source are assigned to a peripheral surface region of the drum.

Furthermore, a movement device for moving a substrate along a linear curve may also be provided.

The sputtering source 31 is preferably a magnetron source, with particular preference a magnetron source system with two magnetron arrangements lying next to one another. The power supply (not represented) to the sputtering source 31 is preferably a medium frequency (MF) or radio frequency (RF) or pulsed DC supply unit, which is coupled to the sputtering cathodes by way of an adaptation network. Preferred voltage ranges of the sputtering cathodes used are 400-800 V. Preferably, an RF sputtering source with 13.56 MHz and/or an MF source with 40 kHz is used. Preferred is a power output to the sputtering cathodes in the range between 500 W and 20 kW. The power is in this case scaled with the surface area of the cathode up to a maximum value of approximately 20 W/cm2.

The sputtering source 31 may be operated in a metallic mode known per se, a reactive mode or a transition mode. Preferred sputtering materials are metals and their oxides and nitrides such as Al, Mg, Zr, Hf, Ta and semiconductors such as Si and their oxides and nitrides.

The plasma source 32 generates a plasma, which comprises excited ions and radicals of a residual gas. The residual gas comprises an inert gas, such as for example argon and optionally one or more reactive constituents, such as for example oxygen or nitrogen. The plasma acts with a modifying effect on layers of the coating material that are deposited from the sputtering source 31 on the substrate. For example, an oxidation or nitridation takes place by means of the plasma source 32. The plasma source 31 may be for example a DC, RF or pulsed DC or DC+HF plasma source device. The ion energy of the plasma produced by means of the plasma source 32 can preferably be set, preferably over a range between 10 EV and 200 EV or else 400 EV. An ECWR plasma source, in which the energy of the plasma particles can be set largely independently of the plasma density in the plasma source, is preferably used.

In further embodiments, further sputtering sources and/or plasma sources are provided in the vacuum chamber.

Arranged in a suitable position in relation to the substrate turntable 21 is an optical measuring device, not represented in FIG. 1, for optical monitoring, by means of which the optical properties of the deposited coating material can be determined. As known per se, with preference transmission and/or reflection are measured intermittently from at least one of the substrates for the determination of optical properties. The optical measuring device is preferably a layer thickness measuring device, with particular preference a spectral photometer, an ellipsometer or a spectral ellipsometer, with which actual values of the layer thickness can be determined in situ at discrete points or along a trajectory.

During the coating, the substrate 10 is moved by the turntable device 20 under the sputtering source 31, coating material being deposited in a coating region along a trajectory lying on the surface 11. In the embodiment represented in FIG. 1, the coating window has a larger surface area than the substrate. It goes without saying that the invention can also be used in the case of substrates in the case of which the substrate has a surface area that is equal to or larger than the coating window.

After the depositing of coating material by means of the sputtering source 31, the substrate is moved further in the form of a circle by the turntable device 20 and at a certain point in time reaches the plasma source 32, it being possible for an additional plasma treatment to take place. For example, a further oxidation of the deposited coating material may take place, as described in detail in the applicant's EP 1 198 607 B1. This may be followed by further deposition of coating material by means of the sputtering source 31. In principle, it is also conceivable that a deposition of coating material takes place by the plasma source 32.

Figure 2:
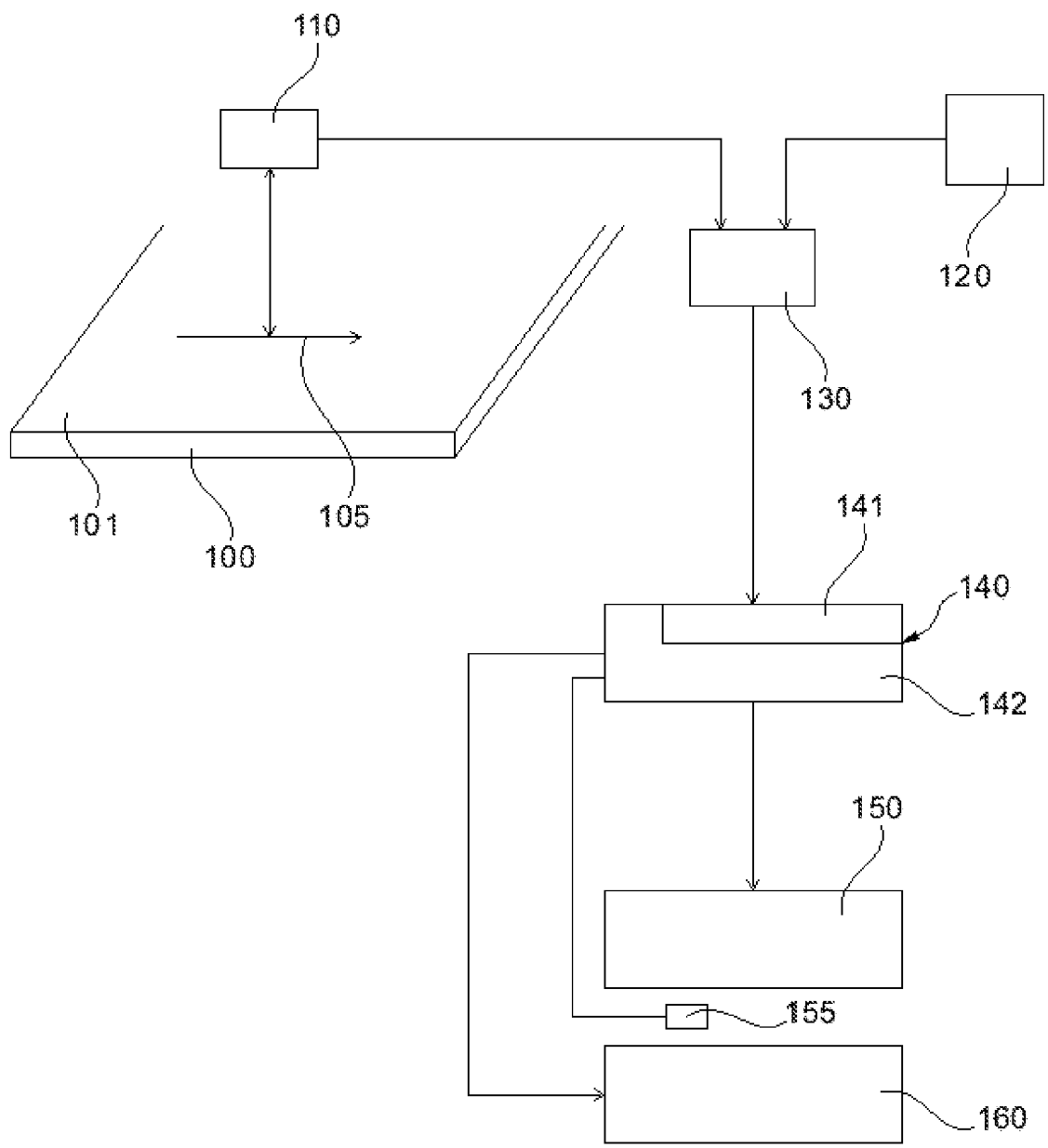
FIG. 2 shows a block diagram of a device according to the invention for carrying out the method according to the invention.

In FIG. 2, a device for carrying out the method according to the invention is represented, comprising a plasma device 150, a movement device 160 and a control module 140.

The plasma device 150 and the movement device 160 may be formed as in the embodiment of FIG. 1. Other embodiments are of course likewise possible. The control module 140 comprises a computing module 141 and a setting module 142. The device also comprises a layer thickness measuring device 110, a predetermining device 120 and a comparing device 130.

In FIG. 2, a device that is set up and designed for determining the actual values by measuring ex situ outside the vacuum chamber is represented, a determination of actual values of a layer thickness of deposited coating material taking place on at least parts of a trajectory 105 in the case of a substrate 100 that has been removed from the vacuum chamber. As a difference from the representation in FIG. 2, in the case of a turntable device, as in FIG. 1, the trajectory is usually curved in a way corresponding to the movement of the substrate in the form of a circular path.

The measured values determined are fed to the comparing device 130 and are compared with the desired values that are stored in the predetermining device 120 and are made available in the comparing device 130. The comparing device 130 delivers a result of the comparison between the actual values and the desired values to the control module 140.

A position sensor 155 can record a position of a substrate. For example, a peripheral edge of a substrate may also be recorded, it being possible with knowledge of a speed of the substrate, in particular the rotational speed of a turntable, for an exact positional determination of the substrate to be performed on this basis by the control module 140.

The computing module 141 of the control module 140 determines parameters of the plasma device 150, in order to alter the amount of coating material deposited per unit of time in such a way that the actual values of the layer thickness of deposited coating material deviate from the desired values by less than a predetermined difference. This may take place by the actual values and the desired values being assigned to certain locations on the trajectory 105. In the case of an installation such as in the exemplary embodiment represented in FIG. 1, the position at which the actual values of the layer thickness are measured may be determined on the then curved trajectory—as a difference from the representation in FIG. 2—by an angle of rotation that corresponds to the rotation of the substrate carrier plate 21 about the axis Z while the substrate is being passed through under the sputtering source 31.

The computing module 141 of the control module 140 determines parameters of the plasma device 150, in order to alter the amount of coating material deposited per unit of time in dependence on the position of the substrate in such a way that the actual values of the layer thickness of the deposited coating material deviate from the desired values by less than the predetermined difference, while it goes without saying that this is assigned a certain coating time or, in the case of a turntable device, a number of coating passes of the substrate. Then, by means of the setting module 142, the control module 140 sets the parameters of the plasma device to the values that are determined by means of the computing module 141.

In the simplest case, if actual values and desired values deviate from one another by more than the predetermined difference, the substrate is brought back into the vacuum chamber and moved with the movement device 160, depositing of coating material by means of the plasma device 150 taking place with the set parameters. Preferably, the power of the control device 140 that is supplied by means of a power supply is modulated in dependence on the position of the substrate, it being preferred in the case of a sputtering device if the sputtering power is modulated in a way corresponding to a triangular profile, a rectangular profile, a sinusoidal profile, a $Sin^2$ profile or a pulse profile.

For the case where a plurality of identical substrates are moved at equivalent positions of the movement device 160, it goes without saying that not only can the determined parameters be used for the depositing of coating material on the substrate 100 for which the actual values of a layer thickness have been determined, but that also the depositing of coating material on some or one or all of the other substrates can be performed with the set parameters of the plasma device. In the case of the embodiment of the invention according to FIG. 1, for example, substrates of the same diameter, the same substrate thickness and the same material may be coated with the same parameters of the plasma device.

The method can be allowed to proceed fundamentally in the same way if the determination of the actual values of the deposited coating material takes place in situ in the vacuum chamber, while it goes without saying that the substrate is no longer removed when the actual values are being determined.

To increase productivity further, there is a step of providing at least one selectable process profile by means of a memory module of the control module 140.

There is also a step of selecting one of the provided process profiles by means of an input unit of the control module 140, the selected process profile being assigned to the control module 140 as an operating configuration. This is followed by a step of controlling the means of movement 160 along a contour 105 of the surface in relation to the surface 101 of the substrate 100 in a way corresponding to the stored process profile that is assigned.

There is furthermore a step of recording measuring parameters at at least one measuring point of the contour 105 on the surface 101 of the substrate 100 by means of a measuring sensor of the installation.

There is furthermore a step of quantifying the material-characteristic parameters determined by means of the sensor by the control module 140 on the basis of predefined surface classifications, predefined material-characteristic parameter ranges being respectively assigned to a surface classification and the corresponding quantification of the corresponding surface classification taking place by triggering material-characteristic parameter ranges on the basis of the material-characteristic parameters.

There is furthermore a step of generating a plasma-source control signal by a computing module of the control module 140 on the basis of the surface classification and a plasma-source parameter profile of the process profile, which characterizes the correlation between the surface classification and the plasma-source control signal.

There is furthermore a step of controlling the plasma source by means of the plasma-source control signal in a way corresponding to the surface classification and plasma-source parameter profile of the process profile for depositing coating material on a surface of the substrate in a coating region along a trajectory lying on the surface of the substrate by means of the plasma device.

Figure 3:
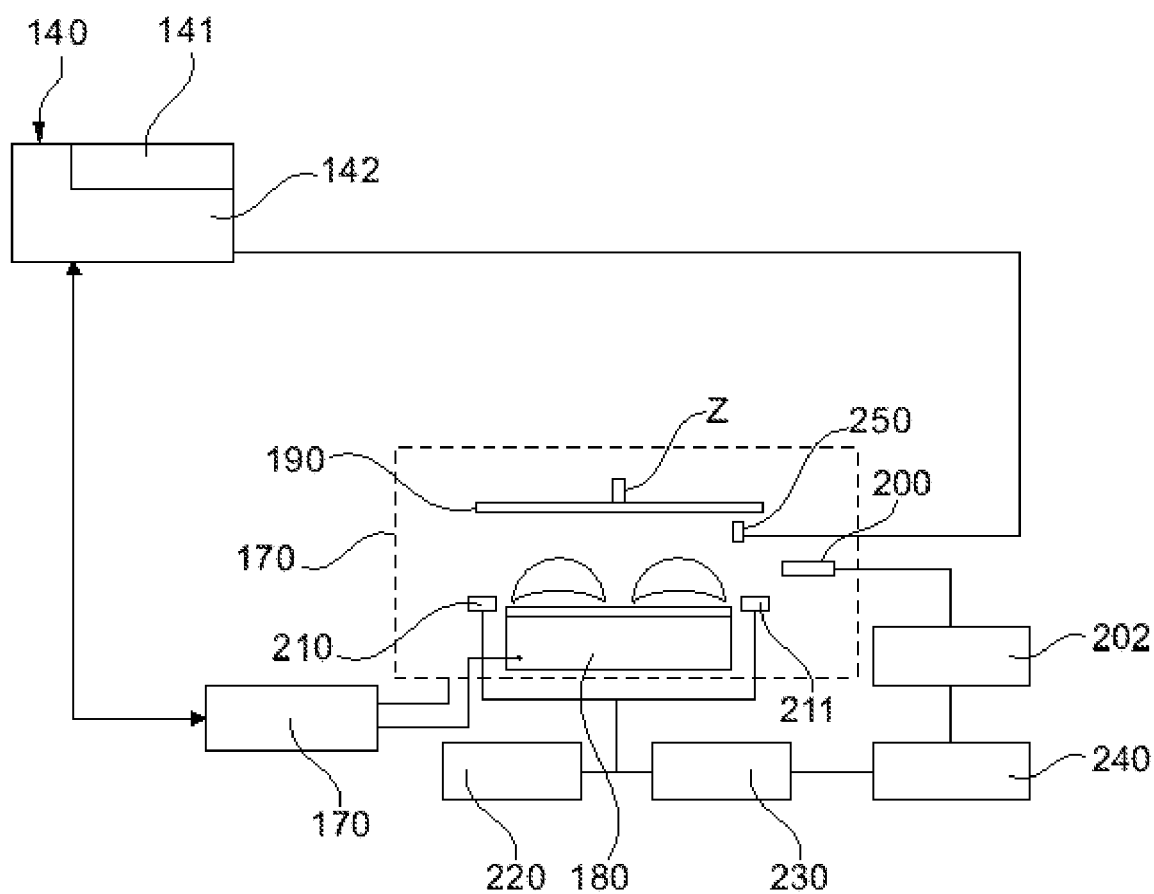
FIG. 3 shows layer thickness distributions on a substrate without and with compensation for a drop in layer thickness at the periphery.

In FIG. 3, a further embodiment of the invention is represented, showing in a sputter-up configuration a dual magnetron 180, which is arranged underneath a substrate plate 190 of a movement device that is otherwise not represented more specifically. From an inert gas tank 220, for example for argon, and a reactive gas tank 230, for example for oxygen, an inert gas and a reactive gas can be introduced into the interior of the vacuum chamber 170 by way of gas inlets 210 and 211. An inert gas flow and a reactive gas flow can be set in dependence on measured values of a sensor 200, for example a lambda probe, the signal of which is evaluated by a sensor evaluation device 202 and fed to an open-loop or closed-loop control device 240. It goes without saying that the vacuum chamber 170 also has pumping devices, which for the sake of simplicity are not represented. The magnetron 180 is connected to a power supply 170 by way of an adaptation network that is not represented.

By means of a position sensor 250 the position of a substrate that is fastened to an underside of the substrate carrier plate 190 but is not represented can be determined. The position sensor 250 may for example record a peripheral edge of a substrate. With knowledge of the rotational speed of the turntable, on this basis an exact positional determination of the substrate can be performed by the control module 140.

Though not represented in FIG. 3, the embodiment also comprises components for determining the actual values and desired values of deposited coating material on the substrate or substrates and also a comparing device for comparing the actual values with the desired values on at least parts of a trajectory lying on the surface of the substrate.

In FIG. 3, the power supplied to the dual magnetron 180 by means of the generator 170 is preferably modulated by the control device 140 in dependence on the position of the substrate. In this case, the magnetron sputtering source 180 may be controlled in an open-loop manner by way of the control device 240 or be controlled in a closed-loop manner by using measured values of the sensor 200.

Figure 4:
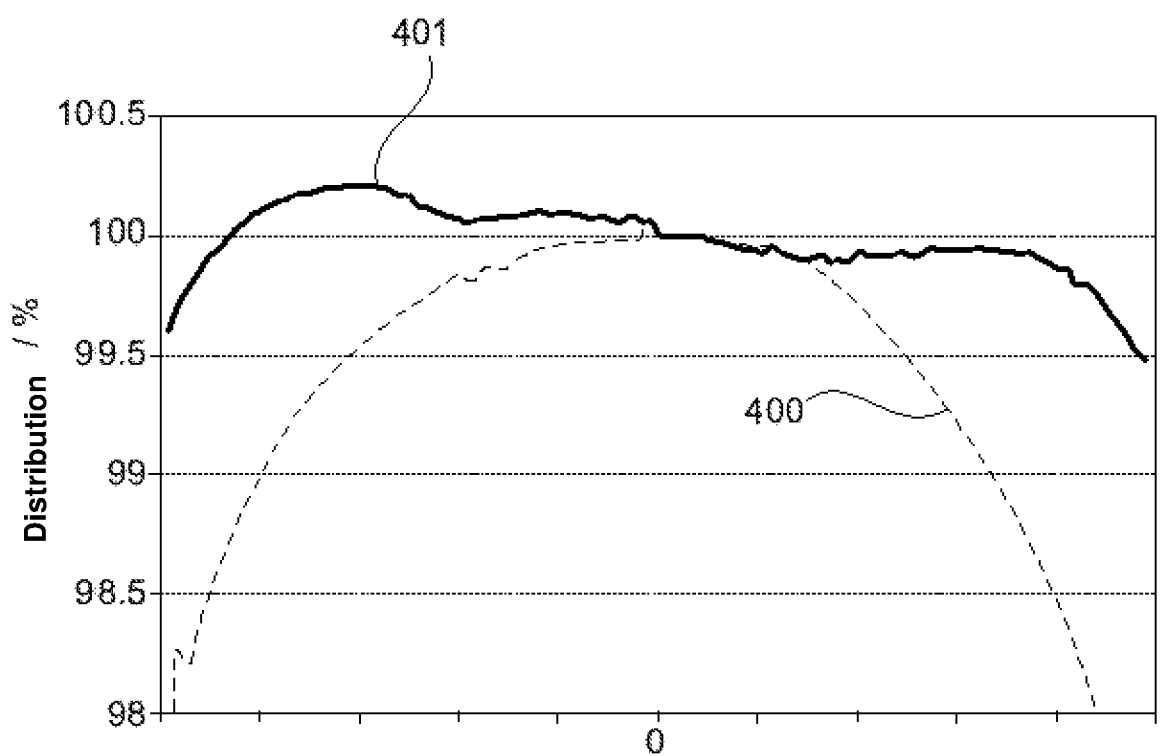
FIG. 4 shows position-dependent power modulation to compensate for the drop in layer thickness at the periphery in FIG. 3.

FIG. 4 shows plots of measured results of layer thickness distributions of coating material deposited by means of a device as represented in FIG. 1 on planar substrates of a circular form, the y axis indicating the layer thickness with respect to an arbitrary value 100 and the x axis indicating the position on a trajectory that runs on the surface through a diameter of the circular substrate. The zero point corresponds to the centre of the circular substrate. The regions to the left and right of the zero point correspond to positions on a trajectory in the direction of movement of the substrate. The layer thickness measurements took place ex situ.

The curves show results of layer thickness measurements of silicon dioxide deposited by means of open-loop controlled RF sputtering. The curve designated by 400 corresponds to a deposition with a constant sputtering power of 10 000 W. The curve 400 shows a maximum of the layer thickness in the region of the centre of the substrate for the deposited layer with a drop of over 2% to the peripheries on the left and right.

The curve 401 shows measured values for SiO2 deposited by the method according to the invention, using a modulation of the sputtering power dependent on the position of the substrate under the centre of the sputtering source. In this case, the electrical power made available by the power supply to the sputtering source was modulated in a way corresponding to a triangular profile, the power having been increased at most by a value of 5% with respect to the constant value with which the curve 400 was sputtered. The modulation according to the invention of the sputtering power led to an increased coating rate in the peripheral regions, with which the reduced coating thickness that otherwise occurs in the peripheral regions was compensated.

Figure 5:
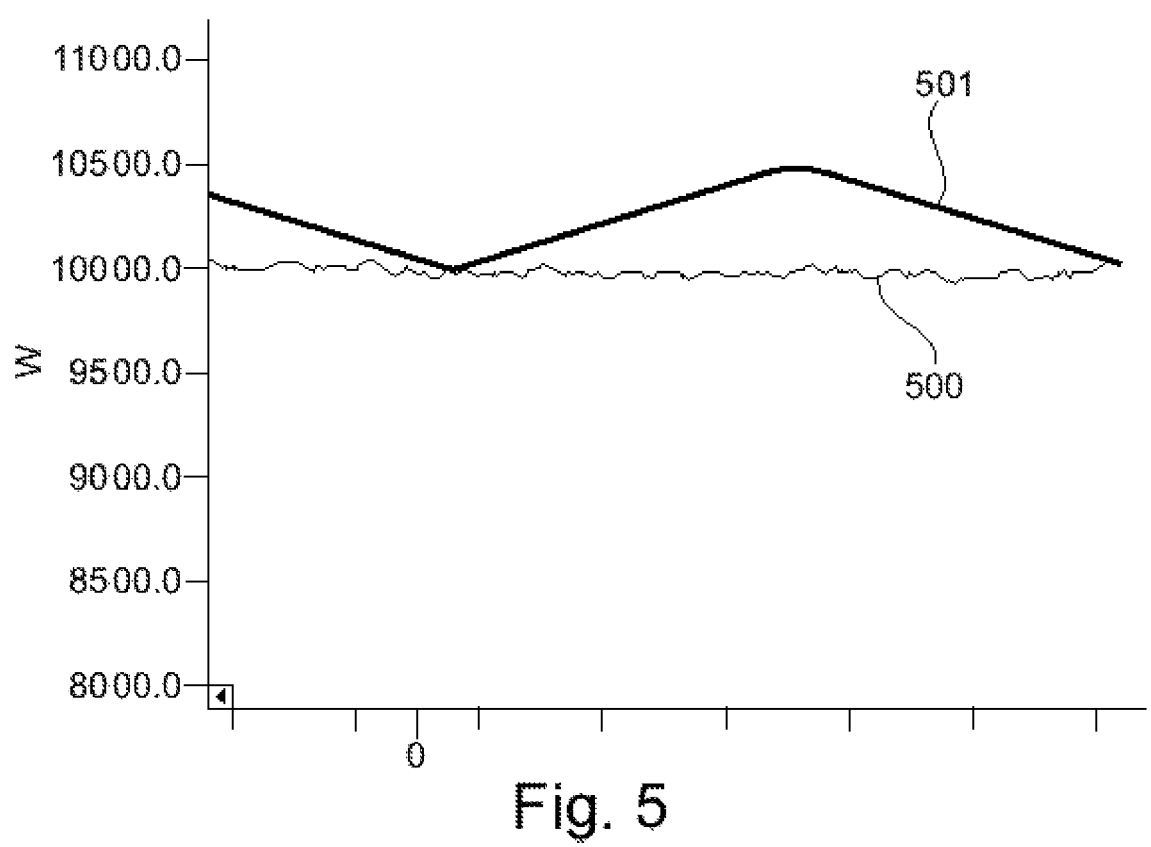
FIG. 5 shows a graphical representation, according to one embodiment of the invention, of the sputtering power used for the deposition of FIG. 4 in dependence on a position on a trajectory on the surface of the substrate, the zero point corresponding to the zero point in FIG. 4.

FIG. 5 shows a representation of the sputtering power used for the deposition of FIG. 4, in dependence on a position on a trajectory on the surface of the substrate, the zero point corresponding to the zero point in FIG. 4. The substrate is moved through under the sputtering source during the deposition. A certain position on the x axis in FIG. 5 therefore corresponds to a point in time at which the centre of the sputtering source is located over the position concerned. The curve designated by 500 corresponds to a constant sputtering power, as is usual in the prior art. The curve 501 corresponds to the sputtering power in dependence on the angle of rotation of the main drive according to the present invention.

The invention claimed is:

1. A method for producing substrates with a plasma-coated surface of a dielectric coating material comprising at least one of the elements silicon, aluminum, magnesium, hafnium, zirconium, niobium, tantalum, titanium, scandium and/or their oxides or nitrides, in a vacuum chamber, which has a plasma device operated with alternating current (AC), the method comprising:
   moving a planar first substrate in relation to the AC operated plasma device along a circular path by a turntable,
   depositing coating material on a surface of the first substrate in a coating region along a trajectory lying on the surface of the first substrate by means of the AC operated plasma device, with
   a) determining actual values of a layer thickness of deposited coating material on at least parts of the trajectory in the direction of movement of the first substrate,
   b) comparing the actual values with desired values of the layer thickness on the at least parts of the trajectory,
   c) determining parameters of the AC operated plasma device for altering the amount of coating material deposited per unit of time in dependence on the position of the first substrate in such a way that the actual values of the layer thickness of deposited coating material deviate from the desired values by less than a predetermined difference,
   d) setting parameters of the AC operated plasma device for altering the amount of coating material deposited per unit of time according to item c) and
   e) depositing coating material by means of the AC operated plasma device with the parameters set in item d),
   wherein the AC operated plasma device comprises a sputtering source and the depositing takes place as sputtering, and the setting of the parameters according to d) comprises an electrical power supplied to the AC operated plasma device, wherein, in order to compensate for a deviation from a layer thickness distribution to be expected at a constant electrical power, the electrical power is modulated in dependence on the current position of sputtering on the first substrate, wherein the electric power supplied to the AC operated plasma device comprises at least one of radio frequency (RF) AC power, and medium frequency (MF) AC power,
   further comprising removing the first substrate from the vacuum chamber,
   wherein determining the actual values of the layer thickness comprises measuring the actual values while the first substrate is outside the vacuum chamber.

2. The method according to claim 1, characterized in that one or more additional substrates are moved at equivalent positions by the turntable and deposition of coating material on a surface of the one or more additional substrates takes place in a coating region along a trajectory lying on the surface of the respective substrate by means of the plasma device, wherein the parameters determined for the plasma device for the first substrate are also utilized for the deposition of coating material on the rest of the one or more substrates.

3. The method according to claim 1, characterized in that the electrical power is modulated according to a triangular profile, a rectangular profile, a sine profile, a $\text{Sin}^2$ profile or a pulse profile of the electrical power.

4. The method according to claim 1, characterized in that parameters of the gas supply to the plasma device and/or parameters of the plasma emission from of the plasma device are additionally set.

5. The method according to claim 4, characterized in that parameters of an electrical current, an electrical voltage and/or a plasma impedance are additionally set.

6. The method according to claim 4, characterized in that parameters of a working gas flow and/or a reactive gas flow are additionally set into the plasma device or into a space between the plasma device and the first substrate.

7. The method according to claim 1, characterized in that the depositing takes place by means of a plasma device which comprises a targetless plasma source.

8. The method according to claim 1, characterized by moving along a curve that runs equidistantly from the plasma device.

9. The method according to claim 1, characterized by moving along a curve that runs non-equidistantly with respect to the plasma device and determining parameters of the plasma device for altering the amount of coating material deposited per unit of time according to claim 1 b) until the actual values deviate from the desired values by less than a predetermined difference.

10. The method according to claim 9, characterized in that the parameters are determined excluding the chord effect.

11. The method according to claim 1, characterized by determining the actual values by means of a layer thickness measuring device, the layer thickness measuring device being formed as a spectral photometer, an ellipsometer, or a spectral ellipsometer.

12. The method according to claim 1, characterized by use of a disc-shaped first substrate.

13. The method according to claim 12, characterized by use of the disc-shaped first substrate with a greatest linear dimension or greatest diameter smaller than a coating window of the plasma device.

14. A method for producing planar substrates with a plasma-coated surface of a dielectric coating material in a vacuum chamber by a coating installation, which has a plasma device operated with alternating current (AC), comprising:
   a) providing at least one selectable process profile by means of a memory module of a control module,
   b) selecting one of the provided process profiles by means of an input unit of the control module, the selected process profile being assigned to the control module as an operating configuration,
   c) controlling a turntable on which at least one planar substrate moves in a circular path by rotation of the turntable,
   d) recording measuring parameters of a contour on the surface of the substrate in the direction of movement of the substrate by means of a measuring sensor of the installation,
   e) quantifying material-characteristic parameters determined by means of the sensor by the control module on the basis of predefined surface classifications, predefined material-characteristic parameter ranges being respectively assigned to a surface classification and the corresponding quantification of the corresponding surface classification taking place by triggering material-characteristic parameter ranges on the basis of the material-characteristic parameters, f) generating a plasma-source control signal by a computing module of the control module on the basis of the surface classification and a plasma-source parameter profile of the selected process profile, which characterizes the correlation between the surface classification and the plasma-source control signal, and g) controlling the plasma source by means of the plasma-source control signal in a way corresponding to the surface classification and plasma-source parameter profile of the selected process profile for depositing coating material on a surface of the substrate in a coating region along a trajectory lying on the surface of the substrate in dependence on the position of the substrate by means of the AC operated plasma device, characterized in that the AC operated plasma device comprises a sputtering source and the depositing takes place as sputtering, and the plasma source parameter profile comprises an electrical power supplied to the AC operated plasma device, wherein the electric power is modulated according to the current position of sputtering on the planar substrate to compensate for a deviation from a layer thickness distribution to be expected at a constant electric power, wherein the electric power supplied to the AC operated plasma device comprises at least one of radio frequency (RF) AC power, and medium frequency (MF) AC power, wherein recording measuring parameters of a contour on the surface of the substrate by means of a measuring sensor of the installation comprises removing the substrate from the vacuum chamber and measuring the measuring parameters while the substrate is outside the vacuum chamber.

15. The method according to claim 14, characterized in that according to a triangular profile, a rectangular profile, a sine profile, a $Sin^2$ profile or a pulse profile the electrical power is modulated.

16. A device for producing substrates with a plasma-coated surface of a dielectric coating material comprising at least one of the elements silicon, aluminum, magnesium, hafnium, zirconium, niobium, tantalum, titanium, scandium and/or their oxides or nitrides, in a vacuum chamber that has a plasma device operated with an alternating current (AC), comprising a turntable for moving a planar substrate in relation to the AC operated plasma device along a circular path, with depositing of coating material taking place on a surface of the substrate in a coating region along a trajectory lying on the surface of the substrate by means of the AC operated plasma device, with a control module which is designed and set up for:

a1) determining actual values of a layer thickness of deposited coating material on at least parts of the trajectory in the direction of movement of the substrate by means of a layer thickness measuring device, b1) comparing the actual values with desired values, made available by a predetermining device, of the layer thickness on the at least parts of the trajectory by means of a comparing device, c1) determining parameters of the AC operated plasma device by means of a computing module of the control module for altering the amount of coating material deposited per unit of time in dependence on the position of the substrate in such a way that the actual values of the layer thickness of deposited coating material deviate from the desired values by less than a predetermined difference, d1) setting parameters of the AC operated plasma device by means of a setting module of the control module for altering the amount of coating material deposited per unit of time according to c1) and e1) depositing coating material by means of the AC operated plasma device with the parameters set in d1), characterized in that the setting of the parameters according to d1) comprises an electrical power supplied to the AC operated plasma device, and the AC operated plasma device comprises a sputtering source and the depositing takes place as sputtering, and wherein, in order to compensate for a deviation from a layer thickness distribution to be expected at a constant electrical power, the electrical power is modulated in dependence on the current position of sputtering on the planar substrate, wherein the electric power supplied to the AC operated plasma device comprises at least one of radio frequency (RF) AC power, and medium frequency (MF) AC power, further comprising removing the substrate from the vacuum chamber, wherein determining the actual values of the layer thickness comprises measuring the actual values while the substrate is outside the vacuum chamber.

17. The device according to claim 16, characterized in that the electrical power is modulated according to a triangular profile, a rectangular profile, a sine profile, a $Sin^2$ profile or a pulse profile.

* * * * *